(12) United States Patent
Wang et al.

(10) Patent No.: US 9,583,587 B2
(45) Date of Patent: Feb. 28, 2017

(54) METHOD FOR MANUFACTURING INJECTION-ENHANCED INSULATED-GATE BIPOLAR TRANSISTOR

(71) Applicant: CSMC TECHNOLOGIES FAB1 CO., LTD., Jiangsu (CA)

(72) Inventors: Wanli Wang, Jiangsu (CN); Xiaoshe Deng, Jiangsu (CN); Genyi Wang, Jiangsu (CN); Xuan Huang, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/902,220

(22) PCT Filed: Jul. 23, 2014

(86) PCT No.: PCT/CN2014/082816
§ 371 (c)(1),
(2) Date: Dec. 30, 2015

(87) PCT Pub. No.: WO2015/010618
PCT Pub. Date: Jan. 29, 2015

(65) Prior Publication Data
US 2016/0372573 A1 Dec. 22, 2016

(30) Foreign Application Priority Data
Jul. 23, 2013 (CN) .......................... 2013 1 0312223

(51) Int. Cl.
*H01L 21/33* (2006.01)
*H01L 21/22* (2006.01)
(Continued)

(52) U.S. Cl.
CPC .... *H01L 29/66348* (2013.01); *H01L 21/2253* (2013.01); *H01L 21/266* (2013.01);
(Continued)

(58) Field of Classification Search
CPC .......... H01L 21/22; H01L 21/33; H01L 21/38
(Continued)

(56) References Cited

U.S. PATENT DOCUMENTS 6,489,204 B1* 12/2002 Tsui .................... H01L 29/7813
257/302
2004/0178457 A1* 9/2004 Francis ............... H01L 29/0839
257/397
(Continued)

FOREIGN PATENT DOCUMENTS

CN    102487078 A    6/2012
CN    102790082 A    11/2012
(Continued)

OTHER PUBLICATIONS

International Search Report, PCT/CN2014/082816.
Office Action dated Nov. 3, 2016 issued in the counterpart Chinese Application No. 201310312223.7, pp. 1-8.

*Primary Examiner* — Jessica Manno
*Assistant Examiner* — Sheikh Maruf
(74) *Attorney, Agent, or Firm* — Polsinelli PC

(57) ABSTRACT

A method for manufacturing an injection-enhanced insulated-gate bipolar transistor, comprising the following steps: an n-type substrate (12) is provided; a p-type doped layer (14) is formed on the n-type substrate (12); a hard layer (20) is formed on the p-type doped layer (14); a groove (40) extending to the n-type substrate (12) is formed by etching on the p-type doped layer (14); an n-type doped layer (50) is formed on the sidewalls and bottom of the groove (40); the hard layer (20) is removed; p-type impurities of the p-type doped layer (14) and n-type impurities of the n-type doped layer (50) are driven in together, where the p-type impurities are diffused to form a p-type base region (60), and the n-type impurities are diffused to form an n-type buffer layer (70); a gated oxide dielectric layer (80) is formed on the surface (Continued)

of the groove (40); and, a polysilicon layer (90) is deposited in the groove having formed therein the gate oxide dielectric layer (80). In the method for manufacturing the injection-enhanced insulated-gate bipolar transistor, the p-type doped layer (14) and the n-type doped layer (50) are driven in together to form the p-type base region (60) and the n-type buffer layer (70), as only one drive-in process is required, production cycle is shortened in comparison with a conventional method for manufacturing the injection-enhanced insulated-gate bipolar transistor.

10 Claims, 8 Drawing Sheets

(51) Int. Cl.
| | | |
|---|---|---|
| *H01L 21/38* | (2006.01) | |
| *H01L 29/66* | (2006.01) | |
| *H01L 29/739* | (2006.01) | |
| *H01L 29/10* | (2006.01) | |
| *H01L 29/06* | (2006.01) | |
| *H01L 21/265* | (2006.01) | |
| *H01L 21/266* | (2006.01) | |
| *H01L 21/225* | (2006.01) | |
| *H01L 21/324* | (2006.01) | |

(52) U.S. Cl.
CPC ...... *H01L 21/26513* (2013.01); *H01L 21/324* (2013.01); *H01L 29/063* (2013.01); *H01L 29/1095* (2013.01); *H01L 29/7397* (2013.01)

(58) Field of Classification Search
USPC ........ 438/138, 139, 270, 543; 257/139, 330, 257/107–109, 655, 140, 133, E21.383, 257/E21.384, E21.389
See application file for complete search history.

(56) References Cited

U.S. PATENT DOCUMENTS

| | | | |
|---|---|---|---|
| 2005/0179082 A1* | 8/2005 | Miyata | H01L 29/1095 257/330 |
| 2007/0249142 A1* | 10/2007 | Hisanaga | H01L 29/0634 438/459 |
| 2008/0135972 A1 | 6/2008 | Ikuta et al. | |
| 2009/0008674 A1 | 1/2009 | Udrea | |
| 2010/0314659 A1* | 12/2010 | Yilmaz | H01L 29/063 257/139 |
| 2012/0292687 A1* | 11/2012 | Lin | H01L 29/0634 257/329 |
| 2013/0037880 A1* | 2/2013 | Liu | H01L 29/6634 257/330 |
| 2013/0161736 A1* | 6/2013 | Hung | H01L 21/0475 257/330 |
| 2013/0334565 A1* | 12/2013 | Hutzler | H01L 29/66333 257/139 |
| 2013/0341643 A1* | 12/2013 | Kudou | H01L 29/66068 257/77 |
| 2014/0091358 A1* | 4/2014 | Blanchard | H01L 29/42308 257/139 |
| 2016/0086804 A1* | 3/2016 | Noguchi | H01L 21/266 438/270 |
| 2016/0197143 A1* | 7/2016 | Naito | H01L 29/66348 257/334 |

FOREIGN PATENT DOCUMENTS

| | | |
|---|---|---|
| CN | 102856192 A | 1/2013 |
| CN | 103022099 A | 4/2013 |
| CN | 103035720 A | 4/2013 |
| CN | 103094324 A | 5/2013 |
| KR | 100299912 B1 | 6/2001 |

* cited by examiner

METHOD FOR MANUFACTURING INJECTION-ENHANCED INSULATED-GATE BIPOLAR TRANSISTOR

CROSS REFERENCE TO RELATED APPLICATIONS

This application is a national stage application (under 35 U.S.C. §371) of PCT/CN2014/082816, filed Jul. 23, 2014, which claims priority to Chinese Application No. 201310312223.7, filed Jul. 23, 2013, the contents of which are incorporated herein by reference in its entirety.

FIELD OF THE INVENTION

The present invention relates to a technical field of semiconductor manufacture, and more particularly, relates to a method of manufacturing an injection-enhanced Insulated Gate Bipolar Transistor.

BACKGROUND OF THE INVENTION

Currently, in an injection-enhanced insulated gate bipolar transistor (IGBT), the buffer layer is formed by generally implanting an N-type dopant, and then a drive-in is performed, a body implantation is performed, then a drive-in is performed again, such that a time period of the drive-in for forming the buffer layer is longer than a time period of the drive-in for forming the body, which results in that a junction depth of the N-type dopant to be deeper than a junction depth of the body. Therefore, when such IGBT manufacturing method is adopted, it requires an additional drive-in to the buffer layer before performing a drive-in to the body, the N-type dopant is distributed and diffused by virtue of a long time period of drive-in, causing the junction depth of the N-type dopant to be deeper than the junction depth of the body, an N+ is formed beneath the body, such that an enhanced injection can be achieved. However, the method of manufacturing the injection-enhanced IGBT requires additionally adding a drive-in process, the production cycle thereof is long.

SUMMARY OF THE INVENTION

Therefore, it is necessary to provide a method of manufacturing an injection-enhanced IGBT which has a shorter production cycle.

A method of manufacturing an injection-enhanced IGBT includes steps as follow: providing an N-type substrate; forming a P-type doped layer on the N-type substrate; forming a hard layer on the P-type doped layer; etching the hard layer to form a hard layer having a trench pattern; etching the P-type doped layer to form a trench extending into the N-type substrate; forming an N-type doped layer on a sidewall and a bottom of the trench; removing the hard layer having the trench pattern; performing a drive-in to the P-type dopant of the P-type doped layer and the N-type dopant of the N-type doped layer together, the P-type dopant forms a P-type base region by diffusing, and the N-type dopant forms an N-type buffer layer by diffusing; forming a gate oxide dielectric layer on a surface of the trench; and depositing a polysilicon layer in the trench on which the gate oxide dielectric layer is formed.

According to one embodiment, the P-type doped layer is formed by ion implantation or diffusion.

According to one embodiment, a concentration of P-type dopant in the P-type doped layer is from $1\times10^{12}/cm^3$ to $1\times10^{20}/cm^3$.

According to one embodiment, in the forming the N-type doped layer on the sidewall and the bottom of the trench, the hard layer is adopted as a mask, the N-type doped layer is formed by diffusion technology.

According to one embodiment, a concentration of N-type dopant in the N-type doped layer is from $1\times10^{12}/cm^3$ to $1\times10^{20}/cm^3$.

According to one embodiment, in the performing a drive-in to the P-type dopant of the P-type doped layer and the N-type dopant of the N-type doped layer together, a temperature of the drive-in is from 1100° C. to 1280° C.

According to one embodiment, in the performing a drive-in to the P-type dopant of the P-type doped layer and the N-type dopant of the N-type doped layer together, a time period of the drive-in is from 20 min to 500 min.

According to one embodiment, the forming the gate oxide dielectric layer on the surface of the trench comprises: oxidizing the surface of the trench to form a sacrificial oxide layer; removing the sacrificial oxide layer by etching; oxidizing the surface of the trench to form the gate oxide dielectric layer.

According to one embodiment, the hard layer is made of silicon oxide or silicon nitride.

A method of manufacturing an injection-enhanced IGBT includes steps as follow: providing an N-type substrate; forming a hard layer on the N-type doped layer; etching the hard layer to form a hard layer having a trench pattern; etching the N-type doped layer to form a trench; forming an N-type doped layer on a sidewall and a bottom of the trench; removing the hard layer having the trench pattern; forming a mask layer in the trench, the mask layer filling the trench; forming a P-type doped layer on a surface of the N-type substrate which forms the trench; removing the mask layer; performing a drive-in to the P-type dopant of the P-type doped layer and the N-type dopant of the N-type doped layer together, the P-type dopant forming a P-type base region by diffusing, and the N-type dopant forming an N-type buffer layer by diffusing; forming a gate oxide dielectric layer on a surface of the trench; and depositing a polysilicon layer in the trench on which the gate oxide dielectric layer is formed.

In above described injection-enhanced IGBT, the P-type dopant of the P-type doped layer and the N-type dopant of the N-type doped layer are driven-in together to form a P-type base region and an N-type buffer layer, only one drive-in process is required, the production cycle is shortened in comparison with a conventional method of manufacturing injection-enhanced IGBT.

DETAILED DESCRIPTION OF THE EMBODIMENTS

For the purpose of better understanding the above objects, features and advantages, embodiments of the present invention will be described in detail hereinafter in conjunction with the drawings. To facilitate the sufficient understanding of the invention, many details are set forth in the following description. However, the present invention may be implemented in other manners than those described herein, and similar extensions may be made by those skilled in the art without deviating from the spirit of the present invention. Therefore, the present invention is not limited by the embodiments disclosed hereinafter.

Figure 1:
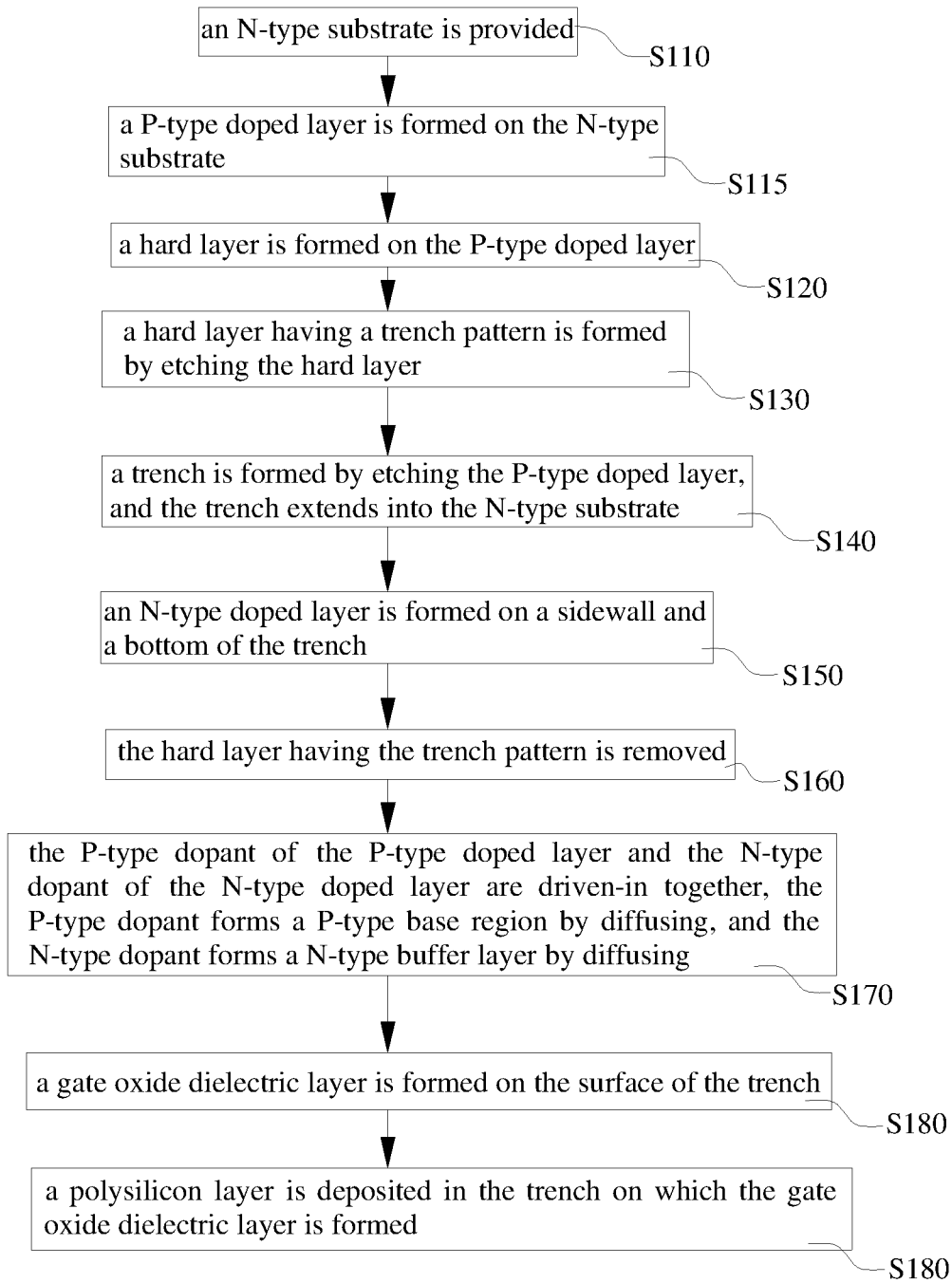
FIG. 1 is a flow chart of a method of manufacturing an injection-enhanced IGBT according to one embodiment.

As shown in FIG. 1, a method of manufacturing an injection-enhanced IGBT according to one embodiment includes the following steps:

S110, an N-type substrate is provided.

Figure 2:
FIGS. 2 though 11 are schematic views of the structures corresponding to the process shown in FIG. 1.

Referring to FIG. 2, the specific resistance of the N-type substrate 12 is in a range of from about 0.01 Ω*cm to 200 Ω*cm. In practical application, the N-type substrate 12 having different specific resistances can be selected according to the IGBT product. The N-type substrate 12 can have a thickness in a range of from 100 μm to 1000 μm.

S115, a P-type doped layer 14 is formed on the N-type substrate 12.

Referring to FIG. 2, a P-type doped layer 14 is formed by performing a P-type doping to the N-type substrate 12. Specifically, the P-type doped layer 14 can be formed by diffusion or ion implantation. The forming method of the P-type doped layer 14 is not limited herein. When the P-type doped layer 14 is formed by ion implantation, the implanted ion can be boron (B), and an implantation concentration of the ions can be from $1\times10^{12}/cm^3$ to $1\times10^{20}/cm^3$. The energy of the implantation ion can be from 20 KeV to 200 KeV.

S120, a hard layer is formed on the P-type doped layer.

Figure 3:

Referring to FIG. 3, the hard layer 20 can be made of silicon oxide or silicon nitride. The thickness of the hard layer 20 can be in a range of 500 angstrom to 100000 angstrom. In practical application, the thickness of the hard layer 20 can be other values. The hard layer 20 covers the P-type doped layer 14. When the hard layer 20 is made of silicon oxide, the hard layer 20 can be formed by methods such as lower pressure $SiO_2$ vapor deposition technology, furnace oxidation, rapid thermal annealing oxidation or in-situ vapor oxidation. When the hard layer 20 is made of silicon nitride, the hard layer 20 can be manufactured by chemical vapor deposition technology.

S130, a hard layer having a trench pattern is formed by etching the hard layer.

The hard layer having the trench pattern is formed by adopting photolithography and etching method to etch the hard layer.

Figure 4:
Figure 5:
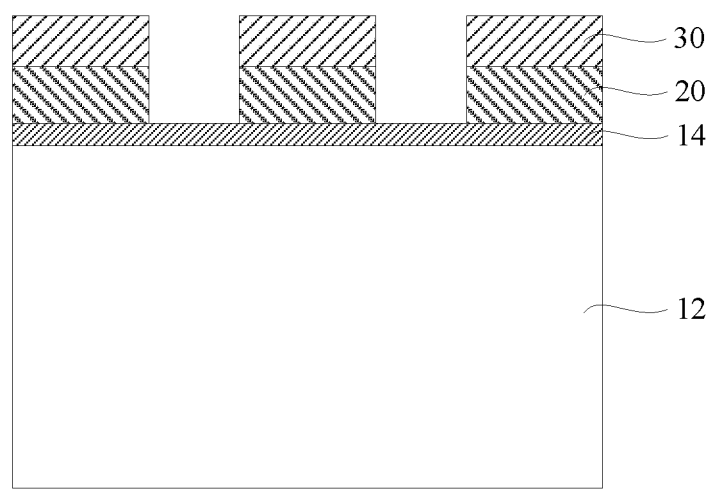

The specific steps of adopting a photo-etching method to etch the hard layer to form the hard layer having the trench pattern is:

Referring to FIG. 4, a photoresist layer 30 is formed on the hard layer 20 first. And then, the photoresist layer 30 is placed beneath an exposure equipment, a photo-mask having the trench pattern on its surface is adopted to perform a photo-mask exposure, the trench pattern on the photo-mask is transferred to the photoresist layer 30, and then developing solution is adopted to remove the photoresist on the exposure region, the photoresist layer 30 having the trench pattern is formed. Referring to FIG. 5, the photoresist layer 30 having the trench pattern is adopted as a mask, the hard layer 20 is etched to form the hard layer 20 having the trench pattern.

The photoresist layer 30 can be formed by static drip or spin coating technology.

S140, a trench is formed by etching the P-type doped layer, and the trench extends into the N-type substrate.

Figure 6:
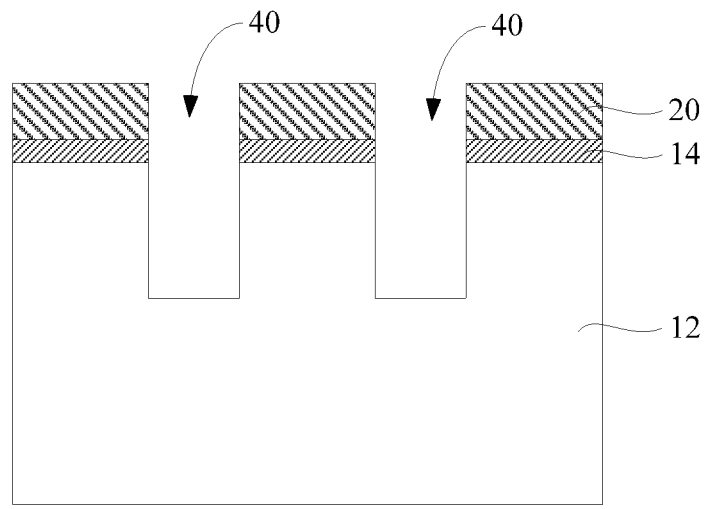
Figure 9:
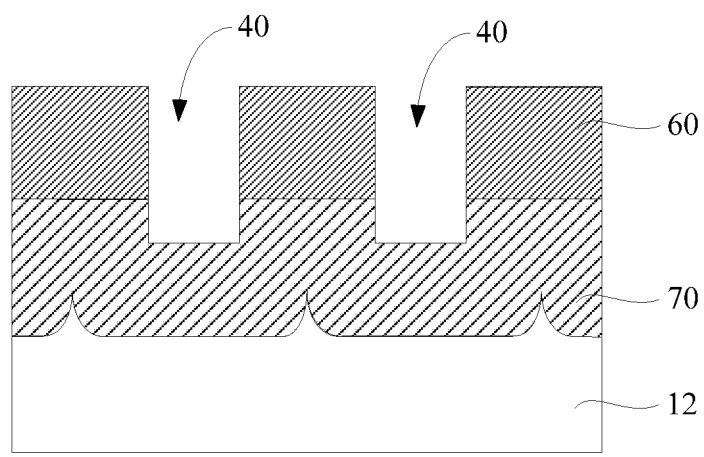

Referring to FIG. 6 and FIG. 9, in the embodiment, a depth of the trench 40 extends through the P-type doped layer 14, and the depth of the trench 40 is deeper than a thickness of the P-body 60 which is formed by performing a drive-in to the P-type doped layer 14. The depth of the trench 40 can be in a range of 0.5 μm to 15 μm. In practical application, one skilled in the art can select the depth of the trench 40 according to a specific condition.

After etching the hard layer 20 to form the hard layer 20 having the trench pattern, and before forming the trench 40 on the P-type doped layer 12, the photoresist layer 30 can be removed. The photoresist layer 30 can also be removed after forming trench 40 on the P-type doped layer 12. The photoresist layer 30 can be removed by dry stripping or wet stripping technology. The dry stripping technology adopts plasma to bombard the photoresist to remove the photoresist layer 30. The wet stripping technology adopts cleaning solution to remove the photoresist layer 30. The cleaning solution adopted by the wet stripping technology can be a mixed liquid of sulfuric acid and oxidizing agent. In other embodiments, the cleaning solution of the wet stripping technology can be other mixture material. It should be noted that, one skilled in the art can selectively adopt the dry stripping technology or the wet stripping technology to remove the photoresist layer 30 according to a practical situation.

S150, an N-type doped layer is formed on a sidewall and a bottom of the trench.

Figure 7:
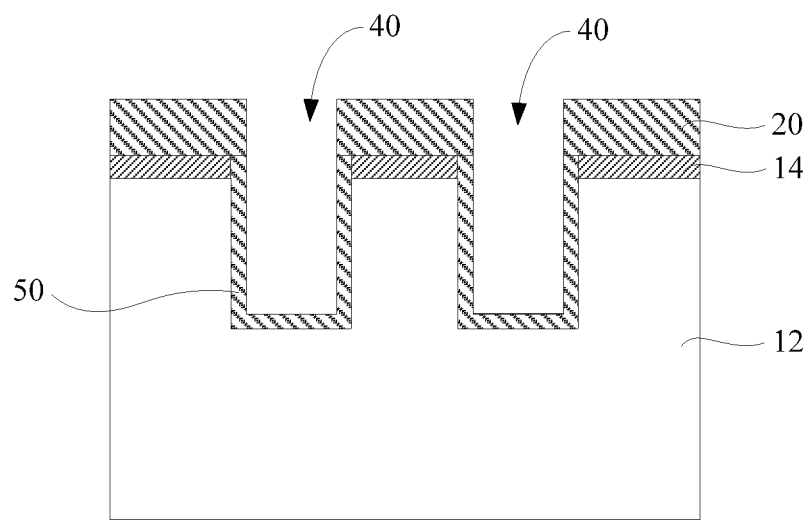

Referring to FIG. 7, in the embodiment, the hard layer 20 having the trench pattern is adopted as a mask, and the N-type doped layer 50 is formed on the sidewall and the bottom of the trench 40 by a diffusion technology.

The temperature of the diffusion technology is from 800° C. to 1250° C., the time period of the diffusion technology is from 10 min to 300 min, the diffusion source is an N-type dopant, such as $B_2O_3$, $POCl_3$ or $PH_3$. In the embodiment, the diffusion source is $POCl_3$. The concentration of the N-type dopant of the N-type doped layer 50 is from $1\times10^{12}/cm^3$ to $1\times10^{20}/cm^3$. The category and concentration of dopant in the growth process can be controlled according to a specific requirement of the device. The N-type doped layer 50 has a thickness from 0.5 μm to 20 μm.

Figure 8:
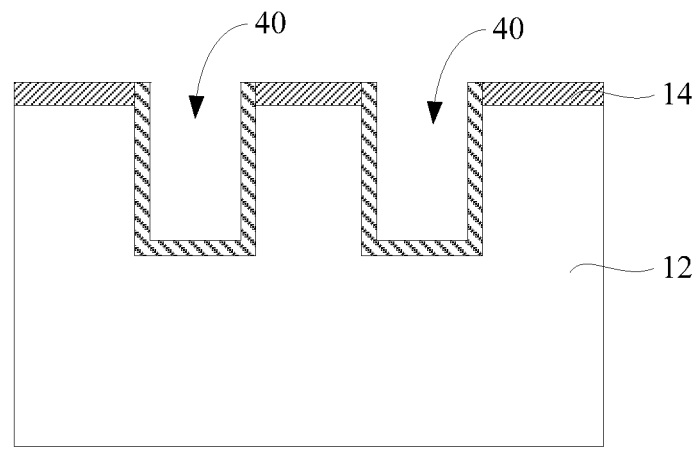

S160, the hard layer 20 having the trench pattern is removed. When the hard layer 20 is an oxide, the hard layer 20 covering on the P-type doped layer 14 is removed by the plasma etching technology or by the buffer oxide etching technology, the structure after removing the hard layer 20 is shown as FIG. 8. The buffer oxide etching technology can adopt a mixed solution of hydrofluoric acid (49%), water and ammonium fluoride to rinse the hard layer 20. In practical application, a removal rate of the hard layer 20 can be adjusted by adjusting concentrations of the hydrofluoric acid and the ammonium fluoride.

When the hard layer 20 is nitride, the hard layer 20 can be removed by wet etching.

S170, the P-type dopant of the P-type doped layer and the N-type dopant of the N-type doped layer are driven-in together, the P-type dopant forms a P-type base region by diffusing, and the N-type dopant forms an N-type buffer layer by diffusing.

Referring to FIG. 9, the drive-in allows the implanted N-type dopant and the P-type dopant to penetrate the silicon crystal in the N-type substrate 12 and form a desired junction depth in the N-type substrate 12, and form a P-type base region and an N-type buffer layer,. In the embodiment, the temperature of drive-in can be from 1100° C. to 1280° C., the time period of drive-in can be from 20 min to 500 min.

In practical application, the temperature and time period of the drive-in can be adjusted according to a specific requirement of the device.

S180, a gate oxide dielectric layer is formed on the surface of the trench.

Figure 10:
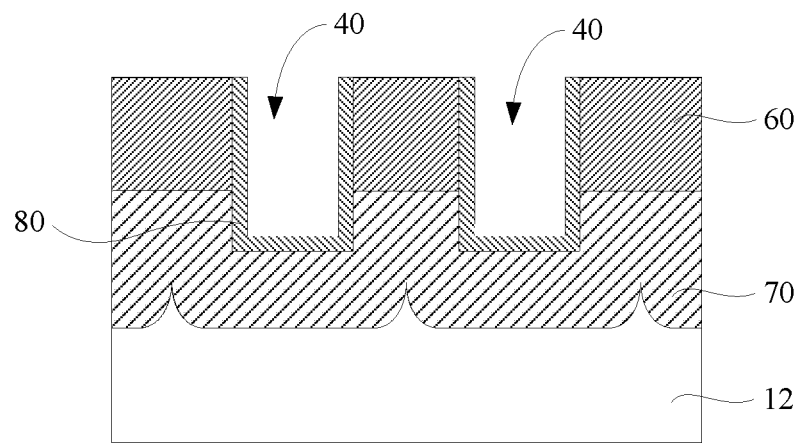

The operation for forming the gate oxide dielectric layer on the surface of the trench includes:

First, a sacrificial oxide layer (not shown) is formed by oxidizing the surface of the trench 40. Then, the sacrificial oxide layer is removed by etching. Subsequently, the surface of the trench 40 is oxidized to form a gate oxide dielectric layer 80. The structure after forming a gate oxide dielectric layer 80 is shown as FIG. 10.

Because many more defects are inevitably formed on the surface of the trench 40 when etching the trench, it affects the quality of the gate oxide dielectric layer 80. Therefore, when the surface of the trench 40 is oxidized to form a sacrificial oxide layer first, and then the sacrificial oxide layer is etched to be removed, and then the gate oxide dielectric layer 80 is formed by oxidation, it facilitates to improve the oneness of the material and the homogeneity of the gate oxide dielectric layer 40, and improving the quality of the gate oxide dielectric layer.

The sacrificial oxide layer can be formed by a dry oxidization or a wet oxidization.

The sacrificial oxide layer can be removed by a wet etching.

The gate oxide dielectric layer 80 can be formed by a dry oxidization. The oxidizing method of the gate oxide dielectric layer 80 is not limited. For one skilled in the art, an appropriate oxidizing method of the gate oxide dielectric layer 80 can be selected according to a requirement of the quality of the gate oxide dielectric layer 80. A thickness of the gate oxide dielectric layer 80 can be in a range from 100 angstrom to 5000 angstrom, for example, the thickness is 1000 angstrom.

S190, a polysilicon layer is deposited in the trench on which the gate oxide dielectric layer is formed.

Figure 11:
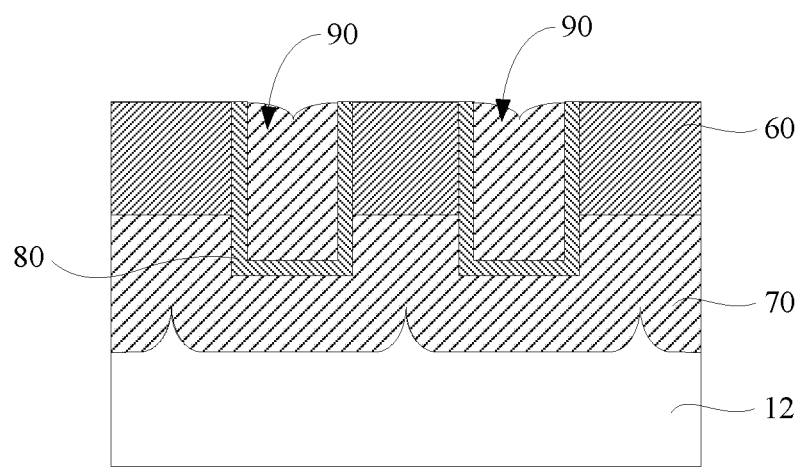

The structure after depositing a polysilicon layer in the trench on which the gate oxide dielectric layer is formed and a back etching is shown as FIG. 11. The polysilicon layer can be formed by chemical vapor deposition, physical vapor deposition or other ways. In practical application, an appropriate deposition method can be selected according to a requirement. In the embodiment, the polysilicon layer 90 can adopt a dry etching to back etch the polysilicon layer, to remove the redundant deposition.

A gate electrode is formed by performing subsequent processes to the polysilicon layer 90. Subsequently, an emitting electrode and a collector electrode are formed by performing front processes, backgrind, back implantation, annealing, and back metallization and other steps to the device obtained by S190, an injection-enhanced IGBT is obtained. All technologies such as performing subsequent processes to the polysilicon layer 9 to form a gate electrode, front processes, backgrind, back implantation, annealing, and back metallization can adopt customary means in the technical field, and will not be limited hereby.

Above described method of manufacturing an injection-enhanced IGBT is merely directed to an operation including: forming a P-type doped layer on the surface of the N-type substrate first; performing an etching to the trench subsequently; and then forming an N-type doped layer by diffusion technology; and then performing a drive-in to the P-type dopant of the P-type doped layer and the N-type dopant of the N-type doped layer together. It is possible that performing an etching to the N-type substrate to form the trench first, and then forming a P-type doped layer on the surface of the N-type substrate; and then forming an N-type doped layer by diffusion technology; and then performing a drive-in to the P-type dopant of the P-type doped layer and the N-type dopant of the N-type doped layer together.

Figure 12:
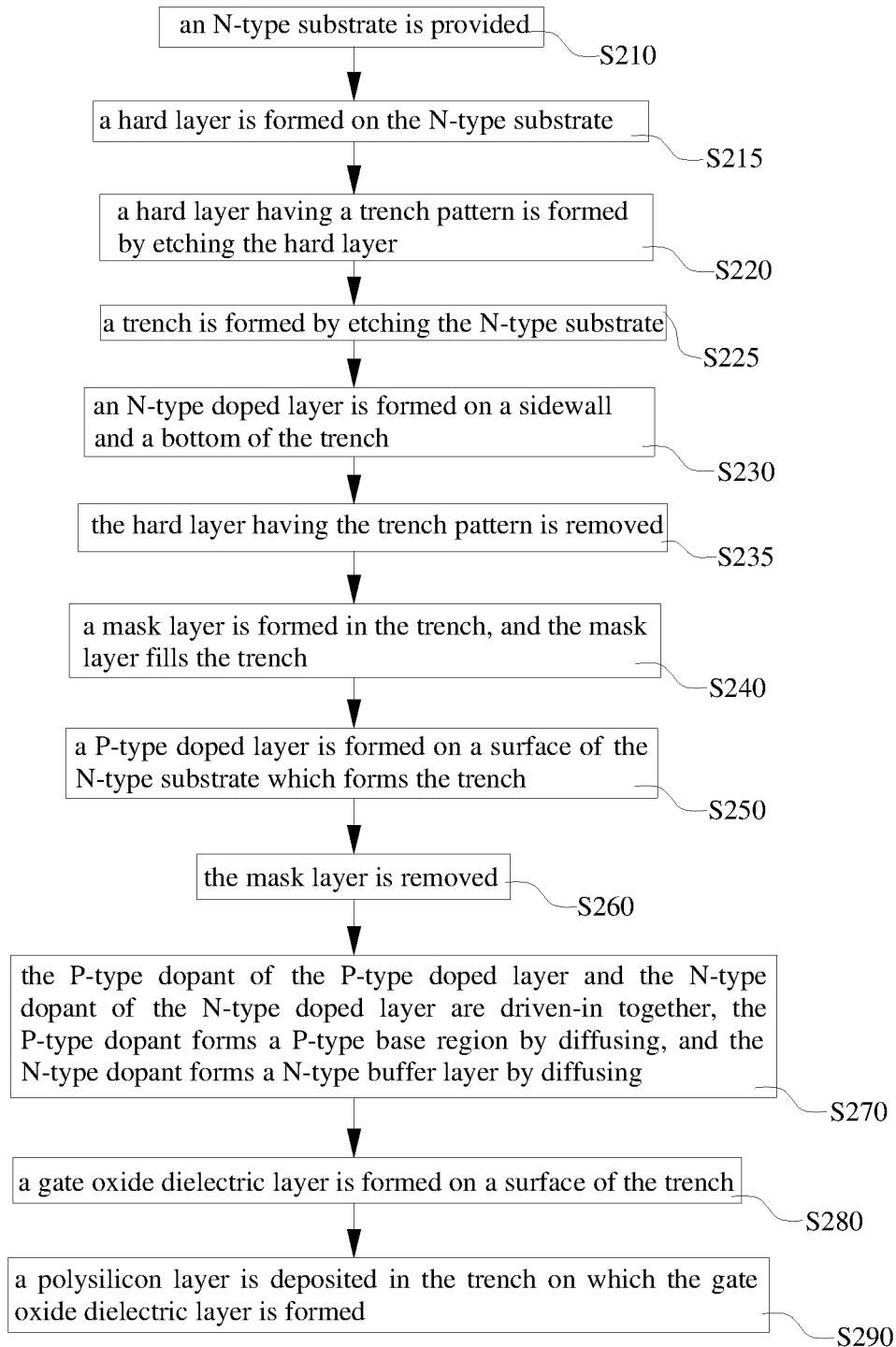
FIG. 12 is a flow chart of a method of manufacturing an injection-enhanced IGBT according to another embodiment.

As shown in FIG. 12, a method of manufacturing an injection-enhanced IGBT according to another embodiment, includes the following steps:

S210, an N-type substrate is provided.

The N-type substrate provided in S210 is same as the N-type substrate provided in S110.

S215, a hard layer is formed on the N-type substrate.

The hard layer in S215 is same as the hard layer in S120. The technology for forming the hard layer in S215 is same as the technology for forming the hard layer in S120

S220, a hard layer having a trench pattern is formed by etching the hard layer.

The technology of etching the hard layer to form a hard layer having the trench pattern in S220 is same as the technology of etching the hard layer to form a hard layer having the trench pattern in S130.

S225, a trench is formed by etching the N-type substrate.

The trench formed in S225 is same as the trench formed in S140.

S230, an N-type doped layer is formed on a sidewall and a bottom of the trench.

In the embodiment, the hard layer having the trench pattern formed in step S220 is adopted as a mask, and the N-type doped layer is formed on the sidewall and the bottom of the trench by diffusion technology. The diffusion technology in S230 is same as the diffusion technology in S150.

S235, the hard layer having the trench pattern is removed.

The technology of removing the hard layer having the trench pattern in S235 is same as the technology of removing the hard layer having the trench pattern in S160.

S240, a mask layer is formed in the trench, and the mask layer fills the trench.

In the embodiment, the mask layer can be made of photoresist. When the mask layer is made of photoresist, the photoresist layer can be formed by performing static drip or spin coating to the surface of the N-type substrate, the photoresist fills the trench, and the photoresist on the surface of the N-type substrate which forms no trench is removed, and the photoresist in the trench is reserved.

S250, a P-type doped layer is formed on the surface of the N-type substrate which forms the trench.

In the embodiment, the P-type doped layer is formed by ion implantation. The ion implantation technology is same as that in S115.

S260, the mask layer is removed.

When the mask layer is made of photoresist, the dry stripping technology and the wet stripping technology can be adopted to remove the mask layer. The dry stripping technology adopts plasma to bombard the photoresist to remove the mask layer. The wet stripping technology adopts cleaning solution to remove the mask layer 30. The cleaning solution adopted by the wet stripping technology can be a mixed liquid of sulfuric acid and oxidizing agent.

S270, the P-type dopant of the P-type doped layer and the N-type dopant of the N-type doped layer are driven-in together, the P-type dopant forms a P-type base region by diffusing, and the N-type dopant forms an N-type buffer layer by diffusing.

The operation in S270 is same as that in S170.

S280, a gate oxide dielectric layer is formed on the surface of the trench.

The operation in S280 is same as that in S180.

S290, a polysilicon layer is deposited in the trench on which the gate oxide dielectric layer is formed.

The operation in S290 is same as that in S190. A gate electrode is formed by performing subsequent processes to the polysilicon layer. Subsequently, an emitting electrode and a collector electrode are formed by performing front processes, backgrind, back implantation, annealing, and back metallization and so on to the device obtained by S290, an injection-enhanced IGBT is obtained. All technologies such as performing subsequent processes to the polysilicon layer to form a gate electrode, front processes, backgrind, back implantation, annealing, and back metallization can adopt customary means in the technical field, and will not be limited hereby.

Figure 13:
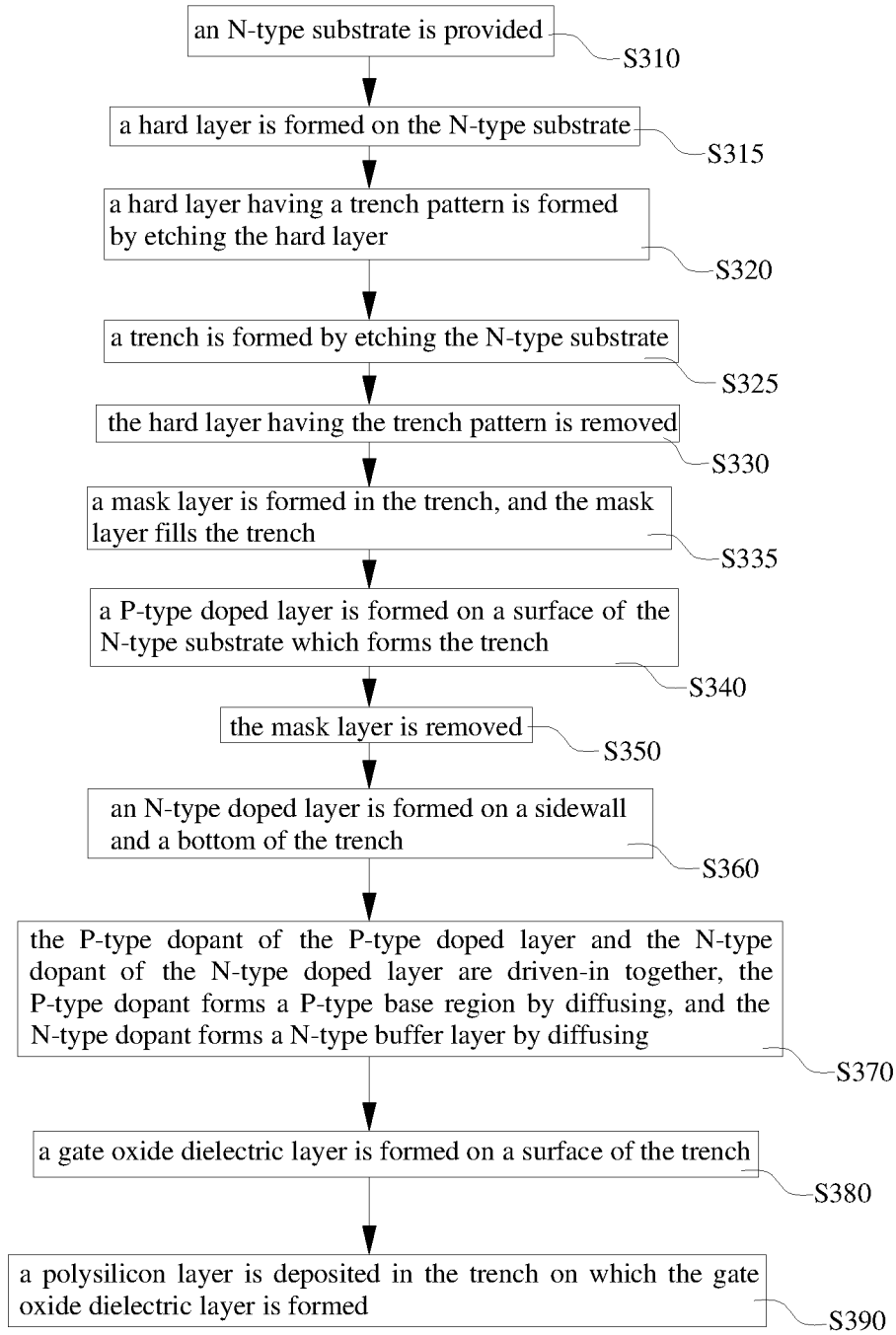
FIG. 13 is a flow chart of a method of manufacturing an injection-enhanced IGBT according to yet another embodiment.

As shown in FIG. 13, a method of manufacturing an injection-enhanced IGBT according to another embodiment, includes the following steps:

S310, an N-type substrate is provided.

The N-type substrate provided in S310 is same as the N-type substrate provided in S110.

S315, a hard layer is formed on the N-type substrate.

The hard layer in S315 is same as the hard layer in S120. The technology for forming the hard layer in S315 is same as the technology for forming the hard layer in S120

S320, a hard layer having a trench pattern is formed by etching the hard layer.

The technology of etching the hard layer to form a hard layer having the trench pattern in S320 is same as the technology of etching the hard layer to form a hard layer having the trench pattern in S130.

S325, a trench is formed by etching the N-type substrate.

The trench formed in S325 is same as the trench formed in S140.

S330, the hard layer having the trench pattern is removed.

The technology of removing the hard layer having the trench pattern in S330 is same as the technology of removing the hard layer having the trench pattern in S160.

S335, a mask layer is formed in the trench, and the mask layer fills the trench.

In the embodiment, the mask layer can be made of photoresist. When the mask layer is made of photoresist, the photoresist layer can be formed by performing static drip or spin coating to the surface of the N-type substrate, the photoresist fills the trench, and the photoresist on the surface of the N-type substrate which forms no trench is removed, and the photoresist in the trench is reserved.

S340, a P-type doped layer is formed on the surface of the N-type substrate which forms the trench.

In the embodiment, the P-type doped layer is formed by ion implantation. The ion implantation technology is same as that in S115.

S350, the mask layer is removed.

When the mask layer is made of photoresist, the dry stripping technology and the wet stripping technology can be adopted to remove the mask layer. The dry stripping technology adopts plasma to bombard the photoresist to remove the mask layer. The wet stripping technology adopts cleaning solution to remove the mask layer. The cleaning solution adopted by the wet stripping technology can be a mixed liquid of sulfuric acid and oxidizing agent.

S360, an N-type doped layer is formed on a sidewall and a bottom of the trench.

The N-type doped layer is formed on the sidewall and the bottom of the trench by diffusion technology. The diffusion technology in S360 is same as the diffusion technology in S150.

S370, the P-type dopant of the P-type doped layer and the N-type dopant of the N-type doped layer are driven-in together, the P-type dopant forms a P-type base region by diffusing, and the N-type dopant forms an N-type buffer layer by diffusing.

The operation in S370 is same as that in S170.

S380, a gate oxide dielectric layer is formed on the surface of the trench.

The operation in S380 is same as that in S180.

S390, a polysilicon layer is deposited in the trench on which the gate oxide dielectric layer is formed.

The operation in S390 is same as that in S190. A gate electrode is formed by performing subsequent processes to the polysilicon layer. Subsequently, an emitting electrode and a collector electrode are formed by performing front processes, backgrind, back implantation, annealing, and back metallization and so on to the device obtained by S390, an injection-enhanced IGBT is obtained. All technologies such as performing subsequent processes to the polysilicon layer to form a gate electrode, front processes, backgrind, back implantation, annealing, and back metallization can adopt customary means in the technical field, and will not be limited herein.

In above described injection-enhanced IGBT, the P-type dopant of the P-type doped layer and the N-type dopant of the N-type doped layer are driven-in together to form a P-type base region, and an N-type buffer layer, only one drive-in process is required, the production cycle is shortened in comparison with a conventional method of manufacturing injection-enhanced IGBT. In the conventional method of manufacturing injection-enhanced IGBT, the implantation positions of the buffer layer and the body are the same, two drive-in processes are performed, causing the body to be diffused, and it is compensated by the P-type dopant and the N-type dopant, thus the resistance in the base region to be increased. In the method of manufacturing above described injection-enhanced IGBT, the implantation positions of the buffer layer and the doped layer are different, the P-type doped layer and the N-type doped layer are driven-in together, the P-type dopant and the N-type dopant are not required to compensate.

The device manufactured by above described method of manufacturing an injection-enhanced IGBT can optimize the performance of the device, such as voltage drop saturation (VDSON).

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing an injection enhanced IGBT (Insulated Gate Bipolar Transistor), comprising steps as follow:
   providing an N-type substrate;
   forming a P-type doped layer on the N-type substrate;
   forming a hard layer on the P-type doped layer;
   etching the hard layer to form a hard layer having a trench pattern;
   etching the P-type doped layer to form a trench extending into the N-type substrate;

forming an N-type doped layer on a sidewall and a bottom of the trench;

removing the hard layer having the trench pattern;

performing a drive-in to the P-type dopant of the P-type doped layer and the N-type dopant of the N-type doped layer together, the P-type dopant forming a P-type base region by diffusing, and the N-type dopant forming an N-type buffer layer by diffusing;

forming a gate oxide dielectric layer on a surface of the trench; and depositing a polysilicon layer in the trench on which the gate oxide dielectric layer is formed.

2. The method of manufacturing the injection-enhanced IGBT according to claim 1, wherein the P-type doped layer is formed by ion implantation or diffusion.

3. The method of manufacturing the injection-enhanced IGBT according to claim 2, wherein a concentration of P-type dopant in the P-type doped layer is from $1\times10^{12}/cm^3$ to $1\times10^{20}/cm^3$.

4. The method of manufacturing the injection-enhanced IGBT according to claim 1, wherein in the forming the N-type doped layer on the sidewall and the bottom of the trench, the hard layer is adopted as a mask, the N-type doped layer is formed by diffusion technology.

5. The method of manufacturing the injection-enhanced IGBT according to claim 1, wherein a concentration of N-type dopant in the N-type doped layer is $1\times10^{12}/cm^3$ to $1\times10^{20}/cm^3$.

6. The method of manufacturing the injection-enhanced IGBT according to claim 1, wherein in the performing a drive-in to the P-type dopant of the P-type doped layer and the N-type dopant of the N-type doped layer together, a temperature of the drive-in is from 1100° C to 1280° C.

7. The method of manufacturing the injection-enhanced IGBT according to claim 1, wherein in the performing a drive-in to the P-type dopant of the P-type doped layer and the N-type dopant of the N-type doped layer together, a time period of the drive-in is from 20 min to 500 min.

8. The method of manufacturing the injection-enhanced IGBT according to claim 1, wherein the forming the gate oxide dielectric layer on the surface of the trench comprises:

oxidizing the surface of the trench to form a sacrificial oxide layer;

removing the sacrificial oxide layer by etching;

oxidizing the surface of the trench to form the gate oxide dielectric layer.

9. The method of manufacturing the injection-enhanced IGBT according to claim 1, wherein the hard layer is made of silicon oxide or silicon nitride.

10. A method of manufacturing the injection-enhanced IGBT, comprising steps as follow:

providing an N-type substrate;

forming a hard layer on the N-type doped layer;

etching the hard layer to form a hard layer having a trench pattern;

etching the N-type doped layer to form a trench;

forming an N-type doped layer on a sidewall and a bottom of the trench;

removing the hard layer having the trench pattern;

forming a mask layer in the trench, the mask layer filling the trench;

forming a P-type doped layer on a surface of the N-type substrate which forms the trench;

removing the mask layer;

performing a drive-in to the P-type dopant of the P-type doped layer and the N-type dopant of the N-type doped layer together, the P-type dopant forming a P-type base region by diffusing, and the N-type dopant forming an N-type buffer layer by diffusing;

forming a gate oxide dielectric layer on a surface of the trench; and depositing a polysilicon layer in the trench on which the gate oxide dielectric layer is formed.

* * * * *